(12) United States Patent
Brillhart

(10) Patent No.: US 6,325,552 B1
(45) Date of Patent: Dec. 4, 2001

(54) SOLDERLESS OPTICAL TRANSCEIVER INTERCONNECT

(75) Inventor: Mark Vodja Brillhart, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/503,876

(22) Filed: Feb. 14, 2000

(51) Int. Cl.[7] .................................................. G02B 6/36
(52) U.S. Cl. ................................................ 385/88; 385/92
(58) Field of Search ............................. 385/88–94

(56) References Cited

U.S. PATENT DOCUMENTS

| | | | |
|---|---|---|---|
| 4,427,879 | 1/1984 | Becher et al. | 250/215 |
| 4,660,069 | 4/1987 | Kochanski et al. | 357/68 |
| 4,858,086 | 8/1989 | Pietrantonio et al. | 362/123 |
| 4,935,856 | 6/1990 | Dragoon | 362/307 |
| 5,122,691 | 6/1992 | Balakrishnan | 307/475 |
| 5,130,761 | 7/1992 | Tanaka | 357/17 |
| 5,386,343 | 1/1995 | Pao | 361/761 |
| 5,386,567 | 1/1995 | Lien et al. | 395/700 |
| 5,412,538 | 5/1995 | Kikinis et al. | 361/792 |
| 5,537,502 | * 7/1996 | Patel et al. . | |
| 5,615,089 | 3/1997 | Yoneda et al. | 361/764 |
| 5,631,497 | 5/1997 | Miyano et al. | 257/668 |
| 5,731,633 | 3/1998 | Clayton | 257/723 |
| 5,744,862 | 4/1998 | Ishii | 257/693 |
| 5,831,833 | 11/1998 | Shirakawa et al. | 361/762 |
| 5,943,216 | 8/1999 | Schmidt | 361/761 |
| 5,952,741 | 9/1999 | Toy | 307/326 |
| 5,974,065 | * 10/1999 | Kanda . | |
| 6,154,371 | 11/2000 | Oba et al. | 361/764 |
| 6,252,726 | * 6/2001 | Verdiell . | |

OTHER PUBLICATIONS

Thomas & Betts, "Tomorrow's Interconnect Technology is Within Your Reach", 1998, Thomas & Betts Corp.

* cited by examiner

*Primary Examiner*—Hung N. Ngo
(74) *Attorney, Agent, or Firm*—Thelen Reid & Priest LLP; David B. Ritchie

(57) ABSTRACT

A method and apparatus for assembly of a printed circuit board (PCB) having surface mount technology (SMT) components and an optics device utilizes a compressive connector to clamp the optics device to the printed circuit board and resist side loads. A metallized particle interconnect or equivalent array interfaces a land grid array on the optics device with a land grid array on the PCB. The connector passes through the PCB and through a hole in an integrated heat sink of the optics device. A pair of optics devices may thus be mounted to opposing sides of the PCB in tandem. Fiber optic cables may be attached to the optics devices so that they lead out of the optics devices parallel to the PCB.

14 Claims, 5 Drawing Sheets

SOLDERLESS OPTICAL TRANSCEIVER INTERCONNECT

BACKGROUND OF THE INVENTION

1. Field of the Invention

The present invention is directed to printed circuit boards (PCBs) incorporating electro-optic modules such as optical transceivers and serial and parallel optics devices (collectively referred to as "optics devices") which have an optical connection to an off-PCB device or cable and electrical connections to the PCB.

2. The Background Art

Electro-optical devices are devices which include an optical input/output (I/O) interface and an electrical I/O interface. Common examples include optical transceivers which are attached to a printed circuit board (PCB) to receive/transmit electrical signals and have a connector for receiving a fiber optic cable.

Common PCB fabrication today uses surface mount technology (SMT). In SMT conductive pads are placed on a surface of a PCB, solder paste is screened onto the pads, and a pick and place machine places all of the SMT components in their respective correct places on the PCB with the leads of the SMT components in contact with the solder paste (which is usually slightly adhesive) on the pads of the PCB. The PCB assembly is then placed in a solder reflow oven which heats the PCB and components to a temperature where the solder paste reflows forming permanent electrical connections between the leads of the components and the pads of the PCB.

It is then necessary to remove the excess solder paste which contains corrosive flux materials to prevent corrosion of the PCB assembly over time. This process is usually carried out by immersion of the PCB assembly in a liquid solder flux removal agent which is usually water-based.

Unfortunately, optics devices, such as optical transceivers, are not entirely sealed due to the need to be able to connect optical fiber to the interior of the device. Such devices contain optical components and optical surfaces which do not respond well to high heat or a liquid phase cleaning process. Materials can be left behind, disrupting optical paths. Furthermore, because these devices usually include low temperature materials such as silicones, the high temperature processing of such optics devices is inadvisable and may lead to low yields and/or subsequent failure over time. Thus, such optics devices should not be exposed to elevated temperatures and excessive moisture.

It is possible to solder such components individually to a PCB using a known hot bar solder approach, but this apparatus is costly and time consuming. It also suffers from poor yield and can result in damage to the optics devices which are often relatively expensive devices.

A solder-type connection is also inadvisable for components with a high density of connections where the component is to be attached to a cable or like device. Where a cable is attached, it is almost inevitable that stress such as shear stresses will be imparted by the cable and its movement (or the attachment of a cable connector to a corresponding socket on the component) to the solder joints connecting the component to the PCB. Such stresses can cause cracks to develop in the connections over time and thereby cause intermittent and permanent failure of the PCB assembly.

Due to the high connection densities used in the types of PCB assemblies incorporating such electro-optic modules, it is extremely inadvisable to utilize techniques that are likely to require rework as rework attempts may cause difficult-to-detect collateral damage to the solder joints of surrounding components.

It would, therefore, be highly desirable to find a way to combine such optics devices with SMT PCBs without the need for soldering or exposure of the optics devices to elevated temperatures or moisture.

SUMMARY OF THE INVENTION

A method and apparatus for assembly of a printed circuit board (PCB) having surface mount technology (SMT) components and an optics device utilizes a compressive connector to clamp the optics device to the printed circuit board and resist side loads. A metallized particle interconnect or equivalent array interfaces a land grid array on the optics device with a land grid array on the PCB. The connector passes through the PCB and through a hole in an integrated heat sink of the optics device. A pair of optics devices may thus be mounted to opposing sides of the PCB in tandem. Fiber optic cables may be attached to the optics devices so that they lead out of the optics devices parallel to the PCB.

DETAILED DESCRIPTION OF A PREFERRED EMBODIMENT

Figure 1:
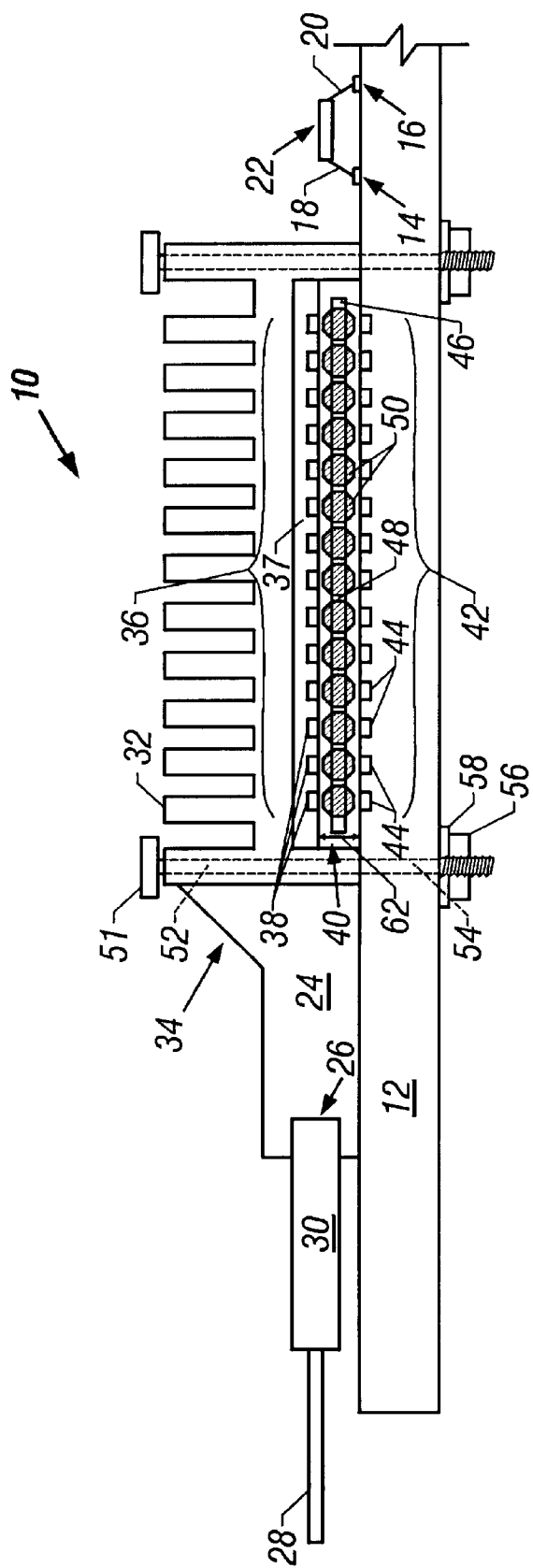
FIG. 1 is a cross-sectional elevational drawing of a printed circuit board assembly in accordance with a specific embodiment of the present invention.

Those of ordinary skill in the art will realize that the following description of the present invention is illustrative only and not in any way limiting. Other embodiments of the invention will readily suggest themselves to such skilled persons having the benefit of this disclosure.

Like reference numerals are used throughout to refer to like elements.

Turning now to FIG. 1, a cross-sectional elevational drawing of a printed circuit board assembly 10 in accordance with a specific embodiment of the present invention is shown. A printed circuit board (PCB) substrate 12 includes SMT pads 14, 16 to which leads 18, 20 of SMT device 22 are soldered. Optics device 24 which may, for example, be a Gore VICEL (available from Gore Associates of Delaware), an Infineon Paroli (available from Infineon of San Jose, Calif.), or any similar optical fiber-electrical signal converter device ("optics device"), includes a connector 26 for receiving a connectorized fiber optic cable 28 having an optical connector 30. Conventional electro-optic transceiver electronics, not shown, may be embedded in optics device 24. The electronics generate heat which must be dissipated. An integrated heat sink 32, preferably formed of metal, such as aluminum, is bonded to connector frame 34. A circuit board 37 includes electro-optical components (not shown) and a land grid array 36 of conductive pads 38. This circuit board may be provided in a recess 40 of heat sink 32. Lines from the electronics, not shown, are connected to pads 38. Those of ordinary skill in the art will now realize that the integrated heat sink 32 may include one or more parts.

PCB 12 includes a land grid array 42 of conductive pads 44 which carry signals from traces (not shown) in PCB 12.

Figure 2:
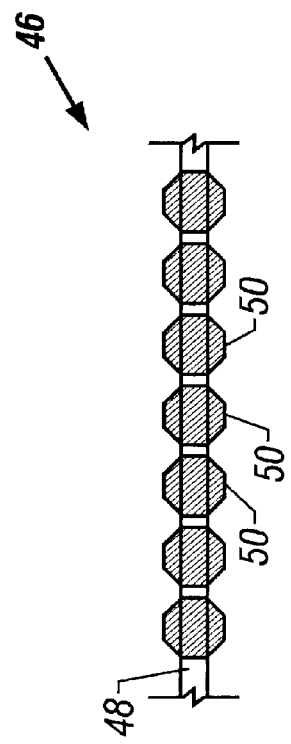
FIG. 2 is a cross-sectional elevational drawing of a metallized particle interconnect array in accordance with a specific embodiment of the present invention.

Metallized particle interconnect array 46, shown in more detail in FIG. 2, includes an insulating polyimide substrate 48 which retains and aligns a plurality of conductive micro columns 50. Micro columns 50 may be fabricated of silver PDMS (poly dimethyl siloxane) or an equivalent mechanically compressible material loaded with electrically conductive material. Such arrays are available, for example, from Thomas & Betts Corporation of Memphis, TN under the product name "MPI™".

Metallized particle interconnect arrays must be compressed against the respective land grid arrays to which they make electrical contact. Note that the distance 62 between the surface of land grid array 36 of optics device 24 and the base of integrated heat sink element 32 which contacts PLB substrate 12 define the amount of compression to be experienced by micro columns 50. This distance will be dictated by the specifications of the particular material used for the micro columns 50 as well as any distance that pads 38, 44 protrude beyond their respective substrate surfaces. It is also preferable that one or more of the surfaces involved in the compressive contact be coated with gold (Au) in order to improve electrical conductivity and circuit reliability. This can be done by coating the land grid array pads 38, 44 with gold or by coating the micro columns 50 with gold. In a specific embodiment of the present invention as depicted in FIG. 1, compression is achieved with a connector 51 passing through a hole 52 in the integrated heat sink element 32 and a hole 54 in the PCB substrate 12. Where connector 51 is a bolt, nut 56 and washer 58 may be used in a conventional manner to compress the assembly. Spring loading (not shown) may also be used. A rivet of metal or plastic may also be used.

It should also be noted that other types of compressible conductors may be used instead of metallized particle interconnects. Such alternative compressible conductors include metallic conductive button connectors marketed under the trade name of "fuzzy button" by the Cinch Jones Corporation, isotropic conductive adhesives and anisotropic conductive films.

Figure 6:
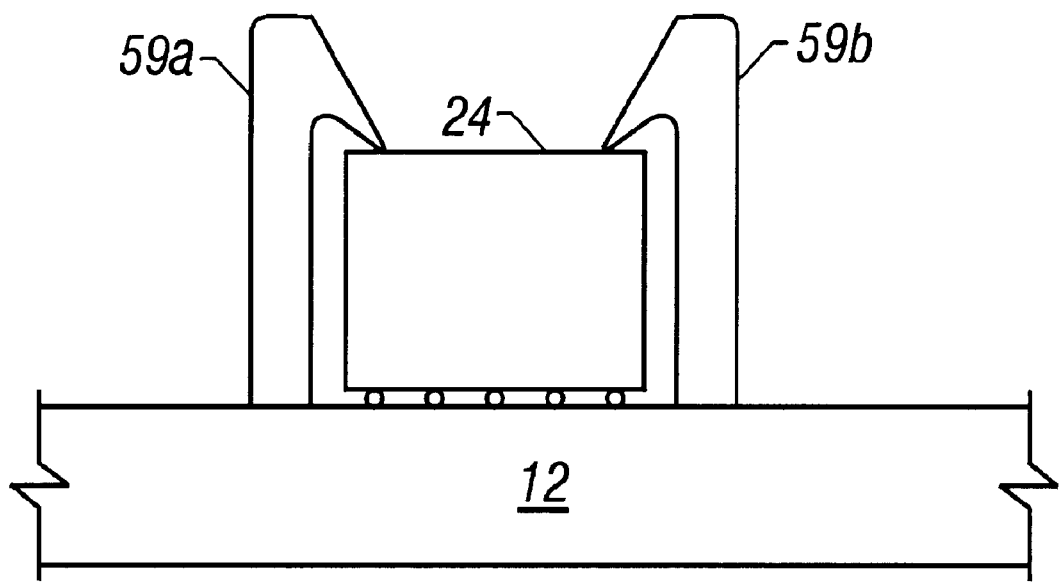
FIG. 6 is a cross-sectional elevational drawing of a printed circuit board assembly in accordance with a specific embodiment of the present invention.
Figure 7:
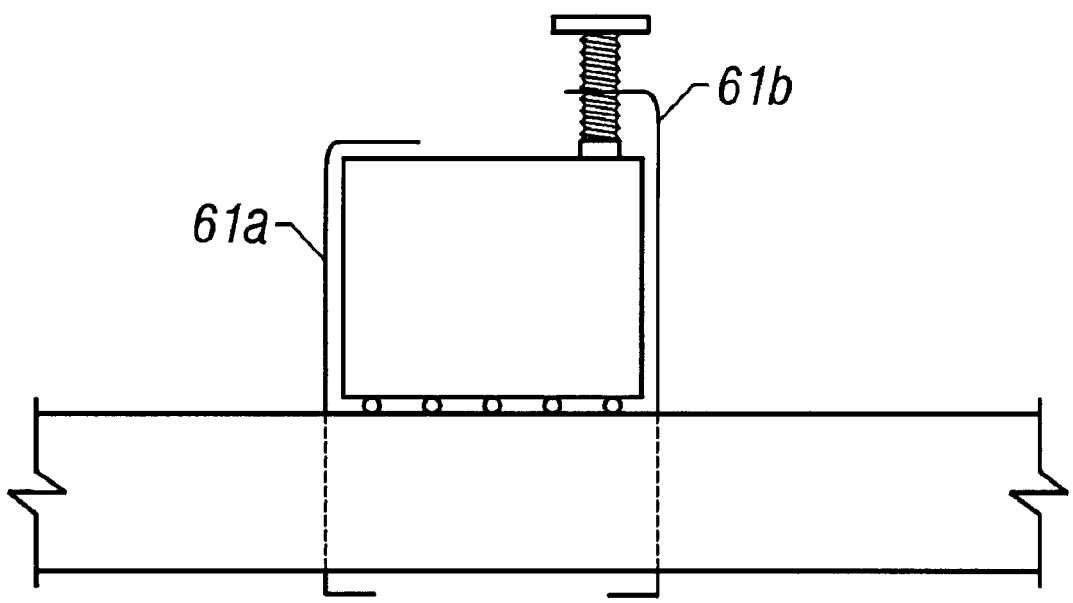
FIG. 7 is a cross-sectional elevational drawing of a printed circuit board assembly in accordance with a specific embodiment of the present invention.

Snap-type connectors may also be used to compress the optics device 24 against PCB substrate 12 as illustrated generally in FIG. 6. In such connectors legs 59a, 59b may be bonded or attached to PCB substrate 12 or extend through it to lock legs 59a, 59b and optics device 24 in place under compression. A screw type connector may also be used to aid in compression. In an alternative embodiment, a C-type clip as shown in FIG. 7 at 61a or a clip with a thumb screw as shown at 61b in FIG. 7 may be used to secure optics device 24 against PLB substrate 12.

Figure 3:
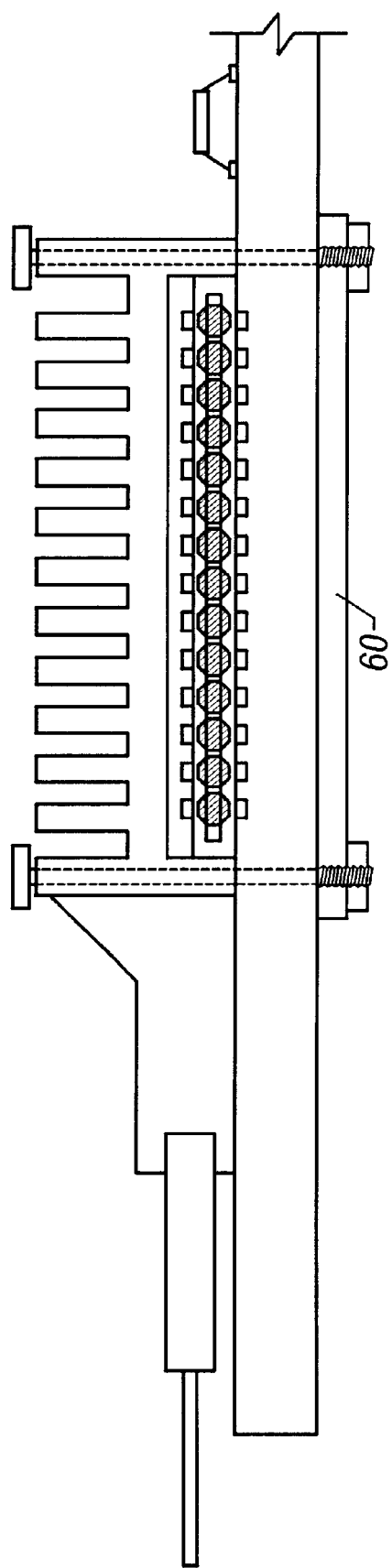
FIG. 3 is a cross-sectional elevational drawing of a printed circuit board assembly in accordance with a specific embodiment of the present invention.

In FIG. 3 another specific embodiment of the present invention is depicted in which a backing plate 60 is also employed.

Figure 4:
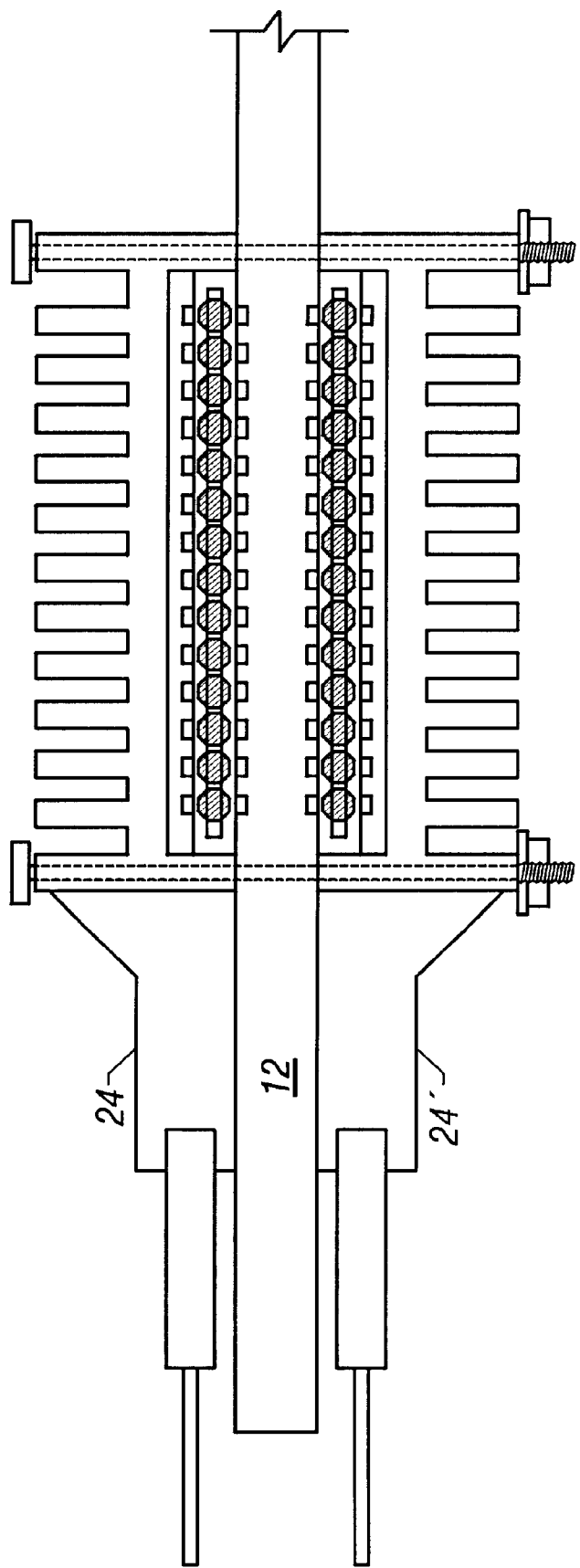
FIG. 4 is a cross-sectional elevational drawing of a printed circuit board assembly in accordance with a specific embodiment of the present invention.

In FIG. 4, another specific embodiment of the present invention is depicted in which two optics devices 24, 24' are mounted to opposite side of PCB substrate in tandem as shown.

Figure 5:
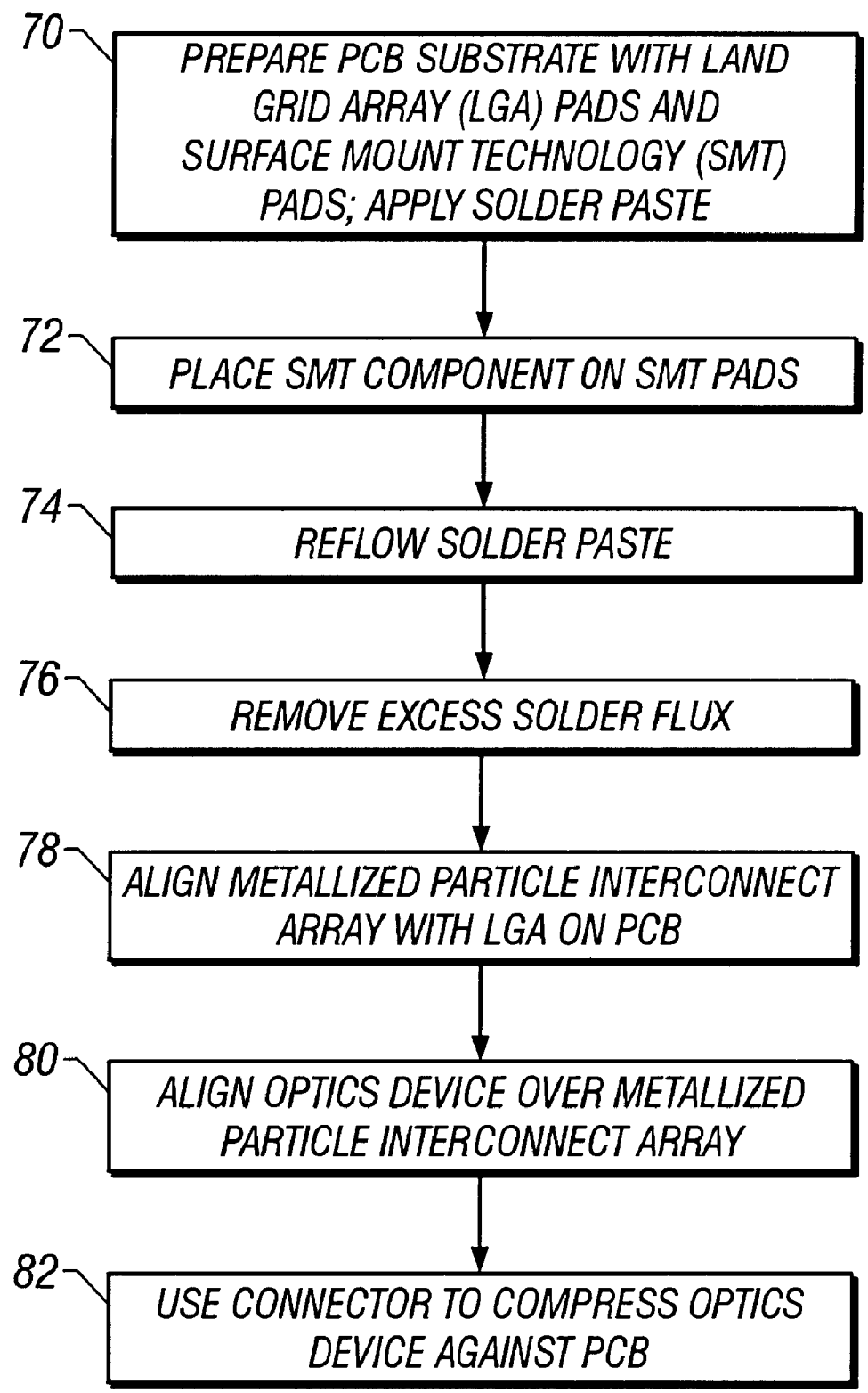
FIG. 5 is a flow diagram of a method for fabricating a printed circuit board assembly in accordance with a specific embodiment of the present invention.

In a method in accordance with a specific embodiment of the present invention, as depicted in the flow diagram of FIG. 5, at 70 the PLB substrate is fabricated having a land grid array for making electrical connection with the metallized particle interconnect array and SMT pads for solder connection to SMT components. The SMT pads are then screened with solder paste containing solder and solder flux.

At 72 the leads of the SMT component are placed on the SMT pads. This may be accomplished with a conventional SMT pick and place machine.

At 74 the PLC assembly is heated to solder reflow temperatures. This may be accomplished with a conventional reflow oven.

At 76 the PLB assembly is washed with a solder paste stripper to remove excess solder flux.

At 78 the metallized particle interconnect array is aligned with the land grid array (LGA) on the PLB.

At 80 the optics device is aligned with the metallized particle interconnect array.

At 82 a connector such as a bolt or rivet is threaded through a hole in an integrated heat sink element of the optics device, through a corresponding hole in the PCB, and pulled tight against a nut, backing plate and/or another optics device so as to compress the optics device(s) against the PCB and tighten the contact between the metallized particle interconnect array and the corresponding land grid arrays that it contacts.

This invention, therefore, avoids the risk of damaging the optics device, its optical wave guides, laser alignment, optical surfaces and the like with reflow temperatures or moisture.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A printed circuit board assembly, comprising:
   a printed circuit board substrate;
   a first land grid array of conductive pads disposed on a first side of said printed circuit board substrate;
   a first metallized particle interconnect array having a plurality of conductive column conductors aligned so that said column conductors are in conductive contact with said conductive pads of said first land grid array;
   a first optics device having an integrated heat sink element disposed on a first side thereof and a second land grid array of conductive pads disposed on a second side of said first optics device opposite said first side of said first optics device;
   a first fiber optic connector disposed in said first optics device, said first fiber optic connector for receiving a fiber optic cable; and
   at least one connector attaching said first optics device, said connector having an element passing through a hole in said integrated heat sink element of said first optics device and through said printed circuit board substrate to exert a compressive force urging said first optics device against said printed circuit board substrate.

2. An assembly in accordance with claim 1 wherein said fiber optic connector is arranged so that a fiber optic cable attached thereto will be disposed initially parallel to said printed circuit board substrate.

3. An assembly in accordance with claim 1, further comprising a surface mount component reflow soldered to a surface of said printed circuit board substrate.

4. An assembly in accordance with claim 2, further comprising a surface mount component reflow soldered to a surface of said printed circuit board substrate.

5. An assembly in accordance with claim 1 wherein said at least one connector comprises a nut and a bolt.

6. An assembly in accordance with claim 1 wherein said at least one connector comprises a rivet.

7. An assembly in accordance with claim 1, further comprising:
- a third land grid array of conductive pads disposed on a second side of said printed circuit board substrate, said second side being opposite said first side;
- a second metallized particle interconnect array having a plurality of conductive column connectors aligned so that said column conductors are in conductive contact with said conductive pads of said third land grid array;
- a second optics device having an integrated heat sink element disposed on a first side thereof and a fourth land grid array of conductive pads disposed on a second side of said second optics device opposite said first side of said second optics device; and
- a second fiber optic connector disposed in said first optics device, said second fiber optic connector for receiving a fiber optic cable;
- wherein said at least one connector also passes through a hole in said integrated heat sink element of said second optics device and also exerts a compressive force urging said second optics device against said printed circuit board substrate.

8. An assembly in accordance with claim 7 wherein said fiber optic connectors are arranged so that fiber optic cables attached thereto will be disposed initially parallel to said printed circuit board substrate.

9. An assembly in accordance with claim 7, further comprising a surface mount component reflow soldered to a surface of said printed circuit board substrate.

10. An assembly in accordance with claim 8, further comprising a surface mount component reflow soldered to a surface of said printed circuit board substrate.

11. An assembly in accordance with claim 7 wherein said at least one connector comprises a nut and a bolt.

12. An assembly in accordance with claim 7 wherein said at least one connector comprises a rivet.

13. A method for fabricating a printed circuit board assembly having an optics device for receiving a fiber optic cable and at least one SMT component attached thereto, said method comprising:

preparing a printed circuit board substrate having a first land grid array of conductive pads disposed on a first side of said printed circuit board substrate and pads for SMT attachment of a SMT component;

reflow soldering said SMT component to said pads for SMT attachment;

removing excess solder flux from said printed circuit board substrate;

aligning a metallized particle interconnect array having a plurality of conductive column conductors so that said column conductors are in conductive contact with said conductive pads of said first land grid array;

disposing an optics device having an integrated heat sink element disposed on a first side thereof and a second land grid array of conductive pads disposed on a second side thereof opposite said first side, and a fiber optic connector for receiving a fiber optic cable, in alignment with said column conductors of said metallized particle interconnect; and urging said optics device against said printed circuit board substrate with a connector passing through a hold in said integrated heat sink element and a hole in said printed circuit board substrate.

14. A method for fabricating a printed circuit board (PCB) assembly having a pair of opposed optics devices for receiving a corresponding pair of fiber optic cables and at least one SMT component attached to said assembly, said method comprising:

preparing a PCB substrate having a first and a second land grid array of conductive pads on opposite sides of said PCB substrate and pads for surface mount technology (SMT) attachment of a SMT component;

reflow soldering said SMT component to said pads for SMT attachment;

removing excess solder flux from said PCB substrate;

aligning a pair of metallized particle interconnect arrays each having a plurality of conductive column conductors so that said column conductors of each array are in conductive contact with said conductive pads of said respective first and second land grid arrays;

disposing first and second optics devices, each having an integrated heat sink element disposed on a first side thereof, a land grid array of conductive pads on a second side thereof opposite said first side, and a fiber optic connector for receiving a fiber optic cable, in alignment with said column conductors of said respective metallized particle interconnect arrays; and urging said first and second optics devices against said PCB substrate with a connector passing through holes in said integrated heat sinks of said first and second optics devices and through said PCB substrate.

* * * * *